United States Patent [19]
Makowiecki et al.

[11] Patent Number: 5,897,751
[45] Date of Patent: *Apr. 27, 1999

[54] METHOD OF FABRICATING BORON CONTAINING COATINGS

[75] Inventors: Daniel M. Makowiecki; Alan F. Jankowski, both of Livermore, Calif.

[73] Assignee: Regents of the University of California, Oakland, Calif.

[ * ] Notice: This patent is subject to a terminal disclaimer.

[21] Appl. No.: 08/730,054

[22] Filed: Oct. 5, 1996

Related U.S. Application Data

[60] Division of application No. 08/334,099, Nov. 4, 1994, which is a continuation-in-part of application No. 08/334,090, Nov. 4, 1994, which is a continuation-in-part of application No. 08/048,373, Apr. 15, 1993, Pat. No. 5,389,445, which is a division of application No. 07/666,971, Mar. 11, 1991, Pat. No. 5,203,977.

[51] Int. Cl.$^6$ .................................................. C23C 14/34
[52] U.S. Cl. .............................. 204/192.15; 204/192.26; 204/192.27
[58] Field of Search .................. 204/192.15, 192.16, 204/192.22, 192.26, 192.27

[56] References Cited

U.S. PATENT DOCUMENTS

| | | | |
|---|---|---|---|
| 4,412,899 | 11/1983 | Beale | 204/192.15 X |
| 4,724,169 | 2/1988 | Keem et al. | 204/192.16 X |
| 5,203,977 | 4/1993 | Makowiecki et al. | 204/192.15 |
| 5,232,571 | 8/1993 | Braymen | 204/192.15 X |
| 5,250,327 | 10/1993 | Ogata et al. | 204/192.15 X |
| 5,296,119 | 3/1994 | Maustakas | 204/192.15 |
| 5,316,804 | 5/1994 | Tomikawa et al. | 204/192.15 X |

OTHER PUBLICATIONS

McKernam et al., "Magnetron . . . Carbide", ICMCTF 91, Waldorf, MD, Apr. 1991.

*Primary Examiner*—Nam Nguyen
*Attorney, Agent, or Firm*—L. E. Carnahan; Henry P. Sartorio

[57] ABSTRACT

Hard coatings are fabricated from boron nitride, cubic boron nitride, and multilayer boron/cubic boron nitride, and the fabrication thereof involves magnetron sputtering in a selected atmosphere. These hard coatings may be applied to tools and engine and other parts, as well to reduce wear on tribological surfaces and electronic devices. These boron coatings contain no morphological growth features. For example, the boron is formed in an inert (e.g. argon) atmosphere, while the cubic boron nitride is formed in a reactive (e.g. nitrogen) atmosphere. The multilayer boron/cubic boron nitride, is produced by depositing alternate layers of boron and cubic boron nitride, with the alternate layers having a thickness of 1 nanometer to 1 micrometer, and at least the interfaces of the layers may be discrete or of a blended or graded composition.

20 Claims, 2 Drawing Sheets

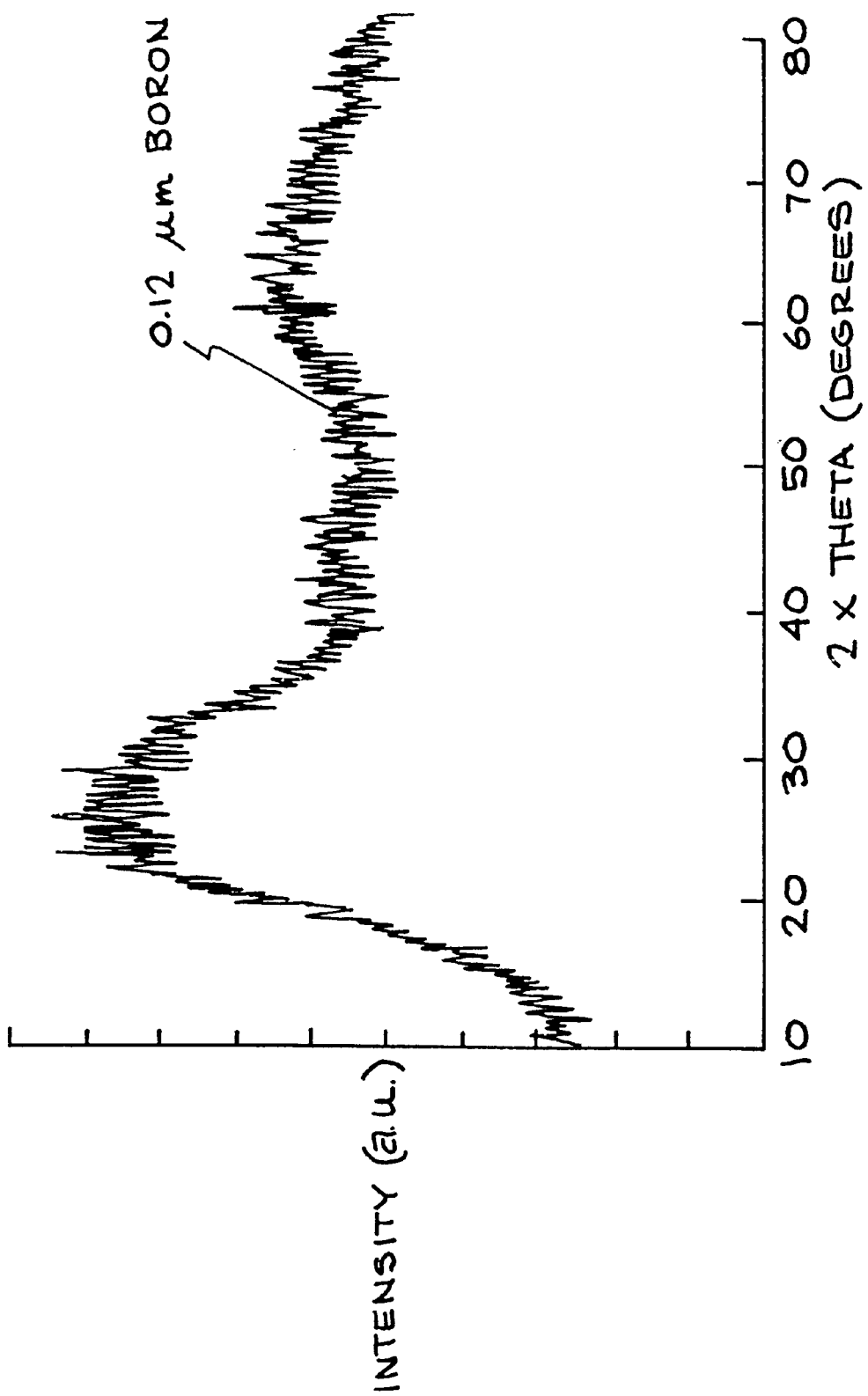

METHOD OF FABRICATING BORON CONTAINING COATINGS

RELATED APPLICATIONS

This application is a division of U.S. application Ser. No. 08/334,099, field Nov. 4, 1994 pending which is a continuation-in-part of U.S. application Ser. No. 08/334,090, filed Nov. 4, 1994, pending, entitled "Magnetron Sputtered Boron Films", which is a continuation-in-part of U.S. application Ser. No. 08/048,373, filed Apr. 15, 1993, now U.S. Pat. No. 5,389,445 issued Feb. 14, 1995, which is a division of U.S. application Ser. No. 07/666,971, filed Mar. 11, 1991, now U.S. Pat. No. 5,203,977 issued Apr. 20, 1993.

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention is directed to thin films or coatings, particularly to thin boron containing hard coatings, and more particularly to multi-phase boron nitride, cubic boron nitride, multilayer boron/boron nitride, and multilayer boron/cubic boron nitride, and to the fabrication thereof.

Thin foils are widely used, for example, as band-pass filters, in transmission filters, and in spectroscopic applications which use irradiation wavelengths in the range of extreme ultra-violet to soft x-rays. Submicron foils, 0.1–0.2 $\mu$m thick, have been produced in various low Z materials (low atomic number) (i.e. carbon, beryllium) by sputtering and evaporation processes. Boron films have been previously produced by resistance heating or electron beam evaporation (Labov, S. et al. Applied Optics 24: 576 (1985)). Previous efforts to prepare boron foils, films, or coatings by sputter deposition were precluded by the lack of availability of dense, high purity sputter targets. However, boron films have now been produced by a magnetron sputtering method described in above-referenced U.S. Pat. No. 5,203,977. Typically sputtered boron films exhibit superior mechanical properties and are preferred because they have fewer defects and finer morphological growth features than foils prepared by evaporative processes.

Boron nitride (BN) films have been produced by a variety of ion-assisted vapor deposition processes including: chemical vapor depositions, evaporation, rf sputtering and ion beam deposition. Boron nitride films prepared by these ion-assisted deposition processes (i-BN) typically are nano crystalline with significant amounts of the more stable hexagonal phase (h-BN). The deposition rate of BN films decreases with increasing ion bombardment.

The preparation of BN films containing cubic boron nitride (c-BN) requires plasma or ion bombarding enhancement of these processes. Also, the previously produced BN films containing appreciable amounts of the cubic phase are highly stressed and reported unstable in air.

The crystalline phases of boron nitride (BN) are analogous to those of carbon. Cubic boron nitride (c-BN), defined as BN with 80% cubic phase, is similar in structure to diamond, and it shares many of diamonds properties including: high thermal conductivity, hardness, high dielectric constant and good chemical stability. Cubic boron nitride is unusual in that it has a wider band gap than any III–V or IV semiconductor, and it can be P or N doped. Thin films of c-BN are potentially useful as hard coatings for tribological applications and cutting tools, as a protective insulator on semiconductors, for optical surfaces in severe environments and for semiconductor devices operating at high temperatures.

Multilayered coatings, which are used, for example, as reflective layers in x-ray optics, are typically tens to hundreds of angstroms thick. A multilayer x-ray mirror is the analog of a quarter-wave stack reflective coating with the added complication of radiation absorption in the layers. Physically, it is an alternating sequence of thin films of highly absorbing and less absorbing materials deposited on an optically smooth substrate. The layered structure is periodic and results in a large angle, resonant reflectivity which is three or four orders of magnitude greater than the simple Fresnel reflection from an unlayered surface. Reflectivity in a multilayer mirror derives from the interference of x-rays coherently scattered from the interfaces between materials of higher or lower x-ray absorption.

The quality of the multilayered optical coating is determined by the perfection of the interfaces between the layers and the uniformity of the layer dimensions. Standard methods for application of multilayer coatings use the physical vapor deposition (PVD) process of evaporation or sputtering.

The coarse layer microstructure produced and the inherent difficulty in controlling the evaporation processes adversely effects the interface perfection and layer dimensional stability, and consequently, the efficiency of the optical coating produced by such methods. The use of computer controlled sputtering processes, such as rf magnetron sputtering process, allows the production of complex multilayer coatings with variable layer thickness and composition. A method for forming multilayer structures using an rf magnetron sputtering process is described in above-referenced U.S. Pat. No. 5,203,977, and titanium/boron (Ti/B) multilayers are described and claimed in above-referenced, copending U.S. application Ser. No. 08/048,373, filed Apr. 15, 1993, now U.S. Pat. No. 5,389,445, entitled "Magnetron Sputtered Boron Films And Ti/B Multilayer Structures".

With the advent of the magnetron sputtering deposition process and the development of high density, crystalline boron targets, it has been found that amorphous boron films which have no morphological growth features can be produced. Such are described and claimed in aboved referenced copending U.S. application Ser. No. 08/334,090 filed Nov. 4, 1994, entitled "Magnetron Sputtered Boron Films". The availability of boron sputter targets has provided the unique opportunity to evaluate the preparation of multi-phase boron nitride, particularly c-BN films by reactive sputtering boron in a partial pressure of $N_2$ or a nitrogen containing gas, in accordance with the present invention. The term "boron nitride" as set forth hereinafter defines a material which is composed of multi-phase boron nitride which includes the i-BN, h-BN, and c-BN phases, while the term cubic boron nitride (c-BN) defines a material which has at least 80% of the cubic phase. It has been found that boron nitride and cubic boron nitride films or coatings can be produced by a reactive sputtering process similar to that used in producing the boron films by utilizing the high purity boron target and a nitrogen containing environment or atmosphere during deposition. This constitutes a new type of BN forming process capable of producing stress-free, single phase films of c-BN. Also, by combining these magnetron sputtering processes, multilayers of boron/boron nitride and boron/cubic boron nitride can be produced. This is accomplished by simply alternating the gas composition from pure argon to a nitrogen containing gas while sputtering from a single boron target. The multilayer films and coatings of boron and boron nitride or cubic boron nitride are a new type of composite hard coatings. It provides a unique method of controlling the stress when the boron nitride layer is predominantly cubic phase (c-BN). These thus produced films or coatings, may be utilized effectively in various electronic components, as well as providing hard surface coatings for tools, machinery equipment, and engine components, etc. Thus, by the discovery of a process for producing boron, boron nitride, cubic boron nitride, and/or multilayers of these materials, prior problems have been addressed, especially stress, and needs particularly for hard coatings, have been provided by this invention, thus greatly advancing the state of the art.

SUMMARY OF THE INVENTION

It is an object of the present invention to provide thin films or coatings containing boron.

A further object of the invention is to provide multi-phase boron nitride films.

A further object of the invention is to provide boron nitride films consisting of primarily the cubic phase (c-BN).

A further object of the invention is to provide a method for producing boron nitride and cubic boron nitride films.

A further object of the invention is to provide stress free films or coatings composed of a multilayer of boron/boron nitride or boron/cubic boron nitride, and wherein the various layers may be, if desired, partially diffused or blended.

A further object of the invention is to provide thin, films containing boron which have high hardness, high thermal conductivity, high dielectric constant, and good chemical stability.

Another object of the invention is to provide a magnetron sputtering process whereby either boron or boron nitride may be produced by changing the deposition environment or sputtering gas.

Another object of the invention is to provide hard coatings on surfaces which coatings are composed of boron, cubic boron nitride, or a boron/cubic boron nitride multilayers.

Other objects and advantages of the present invention will become apparent from the following description and accompanying drawings. The invention involves the production of thin boron nitride (multi-phase BN) or cubic boron nitride (>80% cubic phase) films or coatings. The boron containing films or coatings do not include any morphological growth features, such as columnar boundaries. These ultra-thin films containing boron can be produced as free-standing foils which do not require a protective or supportive layer, such as carbon-hydrogen based polymer films, which would reduce or contaminate the transmitted radiant energy intensity when used as filters. The boron and boron nitride or cubic boron nitride films may be deposited as hard coatings on surfaces, such as tools for machining hardened ferrous materials and on engine parts. As set forth above, c-BN is boron nitride with an 80% cubic phase. For example, by alternating the formation of boron films and cubic boron nitride films, a multilayer boron/cubic boron nitride film or coating may be produced and the various layers of the multilayer may be discrete, diffused, blended, or graded to contain from 0 to 100% boron or cubic boron nitride, and the interfaces of the layers may be discrete or diffused. This can be accomplished by simply alternating the sputtering gas composition from pure argon (for boron) to a nitrogen containing gas (for boron nitride or cubic boron nitride).

A foil is a very thin sheet of material, which is usually not thicker than 0.15 mm. A thin film is a material which may be on a substrate or desired surface, with a thickness not greater than 10 $\mu$m and uniformity within 20% of its average value. In the instant application, the terms thin film and the term foil will be used interchangeably to represent one layer of a particular material which may be selected from a range of thicknesses. The term coating as used herein defines a layer (film) or multilayer deposited on a surface. In the instant application, low Z refers to metals with an atomic number of 20 or less, and high Z refers to any of a group of metals with an atomic number greater than 20, which includes transition metals, refractory metals and noble metals.

The stability of the amorphous sputter-deposited boron suffices for the formation of layered structures even in the reactive and energetic Ti-B binary system, as described and claimed in above-referenced co-pending application Ser. No. 08/048,373, now U.S. Pat. No. 5,389,445. With the use of these thin boron layers as the non-absorbing low Z (low atomic number) layer in high Z/low Z multilayer structures or mirrors, it is possible to further reduce the absorption of such mirrors below that which is attainable with other low Z layers, such as carbon or boron carbide ($B_4C$) layers. This thin boron layer fabrication technique is applicable to production of multilayer mirrors for use with a wide range of optical wavelengths.

The fabrication of boron foils, films and multilayered structures has, previously, not been possible because of the problem of securing sufficiently dense, high purity boron to serve as a target for sputter deposition. A suitable target is now available as a high density, crystalline boron prepared by a method described be Hoenig et al. in Proceedings of the Seventh CIMTEC World Ceramics Congress, Montecatini-Terme, Italy, Jun. 24–28, 1990, published by Elsevier, The Netherlands, which is incorporated by reference. With this high density target material, it is possible to adequately control the sputtering process so that uniform thin amorphous boron and cubic boron nitride foils, films and multilayer structures, can be produced.

Cubic boron nitride (c-BN), as set forth above, is similar in structure to diamond and it shares many of its physical properties, such as high thermal conductivity, high hardness, and good chemical stability. Thin films of c-BN are potentially useful as hard coatings, as a protective insulator on semiconductors, for optical surfaces in severe environments, and for semiconductor devices operating at high temperatures. The method for producing c-BN films involves the reactive sputter deposition of pure boron with a reactive gas. An advantage of this processing technique is the ability to control film stress through manipulation of the deposition gas pressure and flow. Another advantage of this process (using a pure boron target) over similar reactive sputtering processes using hexagonal boron nitride targets involves the elimination of clusters of h-BN transferred from the target to the substrate that promotes the formation of h-BN not c-BN in the deposit. To produce c-BN by reactive sputter deposition requires high purity, dense boron target materials, and successful magnetron sputtering of pure boron has been demonstrated, as exemplified by above-referenced U.S. Pat. No. 5,203,977, and it has been found that by utilizing such a pure, dense boron target in a reactive atmosphere, such as nitrogen gas ($N_2$), and mixtures of argon (Ar) and nitrogen gas, multi-phase BN and c-BN films can be produced by reactive sputter deposition. Also, by varying the composition of the gas in the magnetron sputtering process alternating layers of boron (B) and boron nitride (BN) or cubic boron nitride (c-BN) can be prepared from a single boron target.

BRIEF DESCRIPTION OF THE DRAWINGS

The accompanying drawings, which are incorporated into and form a part of the disclosure, illustrate an embodiment of the invention and, together with the description, serve to explain the principles of the invention.

FIG. 1 is an x-ray diffraction scan (CuK$_\alpha$ high angle $\theta/2\theta$ scan) of a 0.12 $\mu$m thick sputter deposited boron foil which lacks any evidence of crystallinity.

DETAILED DESCRIPTION OF THE INVENTION

Figure 2A:
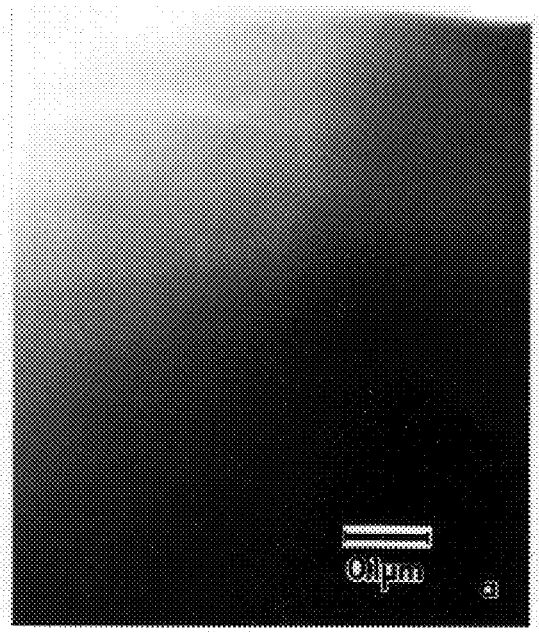
FIGS. 2a and 2b are transmission electron microscopy (TEM) images of 0.12 $\mu$m thick boron foil which shows lack of any growth morphology (e.g. columnar grains) or crystallinity in bright field (FIG. 2a) or dark field (FIG. 2b) images.

The invention is a method for forming thin, boron nitride or cubic boron nitride films and producing multilayers of boron/boron nitride and boron/cubic boron nitride. Quality thin films of boron nitride and cubic boron nitride are produced by a sputtering process which uses dense boron sputtering targets, particularly high density, crystalline boron sputtering targets, which are available through a hot isostatic pressing technique. The sputtering occurs by the attraction of ions created by electrons trapped in the magnetic field of the magnetron sputter source to the dense target material. Multilayer structures of boron and cubic boron nitride may be fabricated from a single boron sputter source by varying the atmosphere or composition of the sputter gas from pure argon (or other inert gases) to pure nitrogen.

The deposition of BN films by reactive magnetron sputtering is more attractive than the prior ion-assisted deposition techniques because it is a less complex process which is quite compatible with commercial coating processes and the fabrication of semiconductor devices. Also, the sputtering of hexagonal boron nitride (h-BN) targets is structurally predisposed against the deposition of the c-BN phase. Another advantage is the process parameter flexibility inherent in reactive magnetron sputtering which offers potentially greater control over the residual stress that has previously made the deposition of films containing large amounts of c-BN unsuitable for any practical applications.

As pointed out above, the formation of boron, boron nitride, and cubic boron nitride films by this magnetron sputtering process, which uses a pure boron target, was not carried out until recently when high purity, usable boron sputtering targets became available. The deposition of boron films using these targets is described in several publications, including: M. McKernan et al., "Magnetron Sputter Deposition of Boron and Boron Carbide", Surface and Coatings Technology, 49 (1991) 411–415; and D. M. Makowiecki et al., "Magnetron Sputtered Boron Films and Ti/B Multilayer Structures", J. Vac. Sci. Technol. A, (1990) 3910–3913.

The availability of pure boron sputter targets also provided a unique opportunity to vary the concept of preparation of c-BN films by reactively sputtering pure boron targets in a partial pressure of $N_2$ or a nitrogen containing gas. Also, unlike the highly stressed and unstable c-BN films prepared by various i-BN processes, the BN films containing c-BN formed by the sputtering of pure boron targets can be made stable by controlling process parameters. The sputtered boron films had a Vickers hardness value as high as 4300 which is higher than any reported value for i-BN films containing c-BN. Hardness testing of c-BN films produced by reactive magnetron sputtering has not yet been completed. However, because the bulk material properties of cubic boron nitride are second only to diamond and considerably harder than boron, a high hardness value is anticipated.

In a manner similar to other refractory nitrides (e.g. TiN) boron nitride can be produced by rf magnetron sputtering of pure boron targets in a reactive gas, such as pure nitrogen, ammonia, and mixtures of these gases with argon. In addition to gas composition the sputtering process parameters varied include: rf sputtering power, substrate material, substrate temperature, substrate bias, and the total pressure of the sputter gas.

As with the previously developed and tested boron films, the c-BN films will be characterized by analytic capabilities, wherein film morphology and structure is determined by scanning electron microscopy (SEM) and transmission electron microscopy (TEM). Rutherford back scattering spectroscopy (RBS) will be used to determine chemical composition. X-ray and electron diffraction of the c-BN films will provide an analysis of this phase composition. A microhardness tester will be used to determine Vickers hardness values.

Due to the hardness of boron and c-BN films, they have good friction and wear characteristics, and these thin films can be used for a protective coating on magnetic memory discs, razor blades, dental instruments, tooling for machining steel, cubic boron nitride films produced by rf sputtering pure boron targets are believed to be harder and are relatively stress-free compared to the i-BN films prepared by rf sputtering hexagonal boron nitride (h-BN) targets. Thus, these c-BN films are more usable because of lower internal stress than the BN films currently prepared by prior deposition processes. The boron/cubic boron nitride multilayer films can be made stress-free.

The magnetron sputter deposition process is performed in an evacuated chamber which is cryogenically pumped to a base pressure of about $10^{-5}$–$10^{-6}$ Pa. In the preferred mode, a base pressure of $6.7 \times 10^{-6}$ Pa is selected. To initiate the sputtering process, the atmosphere of the reaction chamber is filled with either an inert gas for boron films, or a reactive gas for boron nitride films, with the inert gas, including but not limited to argon, helium, neon, krypton, and xenon, and the reactive gas including nitrogen ($N_2$), ammonia ($NH_3$), ammonia-nitrogen-argon ($NH_3$—$N_2$—Ar), and mixtures of nitrogen and argon, etc. In the preferred mode argon gas is used to produce boron films, at a working pressure of about $6.7 \times 10^{-1}$ Pa, and the preferred reactive gas is $N_2$ for producing cubic boron nitride films. These processes are described in greater detail hereafter. The magnetron sputtering source is run in the rf (radio frequency) mode, because the high density boron is an electrical insulator. The substrate or surface, which is to receive the thin film, is held at room temperature, or up to about 700° C., and is positioned directly above the magnetron sputtering source. The deposition process is similar to that described in Makowiecki, D. M. et al. in J. Vacuum Science Technology A 8(6): 3910–3913 (1990), which is incorporated by reference.

Previous attempts to use boron in a sputtering deposition process were limited by the availability of boron targets which could be found only in powders or in thin layers. The recently developed pure dense boron sputtering targets were fabricated by a hot isostatic pressing technique such as that described in the above-referenced Hoenig et al. reference. Briefly, pure boron powder (99.9%) was vacuum sealed in a tantalum can by electron beam welding and then hot isostatically compacted at a temperature of 1700° C. and a pressure of 0.21 GPa argon gas. After removal of the tantalum can, standard ceramic machining techniques were used to fabricate sputtering targets from the monolithic piece of boron. The crystalline boron product has a near theoretical density (2.36 g/cc) and an isotropically uniform microstructure.

Thin boron and cubic boron nitride films are sputtered onto any of a variety of substrates or surfaces at room temperature. The receiving substrate or surface can be any of a variety of quartz or glass substrates, including but not limited to NaCl-coated float glass, as well as tools, machining equipment, parts, etc. The film produced has a thickness of less than 10 $\mu$m, preferably in the range of 1.0–2.0 $\mu$m.

A magnetron sputter deposition process has also been used to fabricate the multilayer structures composed of low Z and high Z layers such as Ti/B multilayer structures described and claimed in above-referenced copending application Ser. No. 08/048,373. This process is similar to that described in Jankowski, A. F. et al. in SPIE Conference Proceedings 984: 64–74 (1988), which is incorporated by reference. The deposition apparatus for the low Z/high Z multilayer structures was comprised by a rotating carrousel of water-cooled substrates which passed sequentially over an array of sputtering target materials. Water cooling is utilized because boron reacts with many metals, such as Ti. The magnetron sources were arranged so that each layer deposition would be followed by an alternate layer material. The magnetron sputter guns, with the high Z materials operated in a DC mode using a solidstate power supply, about 1 to 10 Kw, and were arranged in a circular array beneath the substrate table. The substrate table was rotated, which provided continuous repeating movement of the substrates over the center of each magnetron gun. Typical rotation frequencies ranged from about 0.001 to 0.2 $sec^{-1}$. The sputter deposition rates were found to vary linearly with the power supplied to the magnetron gun.

Such a deposition apparatus for low Z/high Z multilayers is suitable for sputtering with a variety of high Z target materials including, but not limited to titanium, tin, and various refractory metals, noble metals, or transition metals, interspersed between dense low Z target materials, including, but not limited to, boron, beryllium, carbon, cubic boron nitride, and boron carbide. The sputtering process takes place in an inert and/or reactive gas atmosphere, which could include helium, neon, krypton, xenon and argon, with argon preferred in particular; or in a reactive atmosphere which includes nitrogen gas, ammonia and mixtures with argon. Cryogenic pumping was used to maintain the inert gas pressure, for example, in the range of about 2 to $15 \times 10^{-1}$ Pa. The receiving substrate was masked on an oxygen-free substrate table and kept at room temperature. The target to substrate distance was about 2–20 cm. The low Z/high Z multilayer structures produced contained 50–100 layers with a nominal repeat sequence of 7–10 $\mu$m.

The low Z/high Z multilayered structures were characterized by several techniques, including x-ray diffraction (XRD), transmission electron microscopy (TEM), and Auger electron spectroscopy (AES).

The layer pair spacings of the low Z/high Z multilayer structures were measured at grazing incidence using a standard powder diffractometer operated in the $\theta/2\theta$ mode. Electron diffraction provided complimentary information to that obtained via x-ray diffraction to determine the crystalline state of a thin film.

Atomic concentration profiles of the low Z/high Z multilayers are measured with Auger electron spectroscopy (AES) profiling.

Thin films of cubic boron nitride (c-BN) may be produced with the magnetron sputtering process used to produce the boron films except the sputter gas is reactive rather than inert, and may, for example, contain 5 to 100% nitrogen ($N_2$) gas instead of pure argon (Ar) as in the boron film fabrication.

Using the magnetron sputtering process, boron/cubic boron nitride (B/c-BN) multilayers may be produced. The multilayer B/c-BN process, for example, is essentially a combination of depositing B and c-BN in alternating layers from 1 nanometer to 1 micrometer thick by alternating the gas composition and using a single source. The interfaces of the layers can be either discrete or diffuse (blended or graded composition). The various layers may also be essentially B or c-BN, or may be a blend of B and c-BN, depending on the application therefore. Both boron and cubic boron nitride are very hard and ideal for wear surfaces. Both materials are very stressed because of the intrinsic atomic structure thereof. Layering these materials eliminates the stress problem in much the same way as plywood is stronger than the same thickness of solid wood of the same type.

This invention thus involves the production of very hard films or coatings of boron nitride (BN), cubic boron nitride (c-BN), and multilayer coatings of boron/cubic boron nitride (B/c-BN) by a process which involves magnetron sputtering and using a single source. Pure sense boron sputtering targets fabricated by a hot isostatic pressing technique described above are utilized with either an inert gas (e.g. argon) or a reactive gas (e.g. nitrogen) to produce either boron or boron nitride/cubic boron nitride, or by alternating these techniques, multilayered boron/cubic boron nitride, can be produced, as described in detail in the following examples.

EXAMPLES

1. Formation of Boron Films

A boron (B) film of approximately 0.12 $\mu$m thickness, was produced by sputtering boron onto a NaCl-coated float glass substrate at room temperature. The coated glass substrate was prepared by thermally evaporating NaCl onto glass, which was precleaned using a detergent, deionized water and an alcohol rinse, and dried with argon gas. The substrate temperature for the NaCl evaporation was 23° C. The high density crystalline boron target was rf magnetron sputtered at 400 watts in a 1.8 Pa argon atmosphere. The thin boron film was deposited at a rate of 0.1 nm/sec. when the target to substrate separation was 7 cm. The base pressure of the cryogenically pumped system after heating the interior to 80° C. for several hours was $5.3 \times 10^{-5}$ Pa.

2. Formation of Cubic Boron Nitride Films

A cubic boron nitride (c-BN) film of approximately 0.1–10 $\mu$m thickness, can be produced by the process of Example 1, except the boron target was rf magnetron sputtered in a 1.8–2.1 Pa nitrogen atmosphere. The sputter gas for c-BN fabrication contains from 5 to 100% nitrogen ($N_2$) gas, with the remaining gas of the composition be argon, for example. Also, a reactive sputter gas (Ar-$N_2$ mixture) may be used with hexagonal boron nitride targets, but this would result in predominantly hexagonal boron nitride (h-BN) in the films, and such are not as hard as c-BN.

3. Formation of Boron/Cubic Boron Nitride Multilayers

Boron/cubic boron nitride (B/c-BN) multilayer films or coatings of approximately 1–10 $\mu$m thickness, may be produced by alternately rf magnetron sputtering of a single pure boron target in an argon atmosphere and then in a nitrogen atmosphere. The magnetron sputtering target source is arranged on the apparatus so that the deposition of a boron layer would be immediately followed by deposition of a cubic boron nitride layer. While the above process is preferred, wherein only the gas is alternated, multilayers can be produced using two separate sources, each with an inert or reactive gas, and the substrate to be coated is moved alternately from one source to the other, or the sources alternately moved. By varying the composition of the gas various layers of boron and cubic boron nitride may be diffused (blended or graded), or discrete.

Figure 2B:
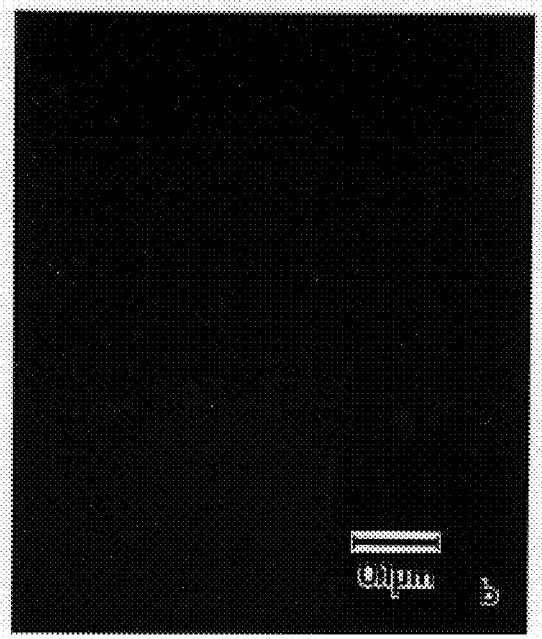

The boron films, fabricated as above-described were examined for the extent of crystallization with a high angle lens. No evidence of crystallization was evident for the boron films or for a 0.12 $\mu$m-thick boron foil, as shown in the diffraction scan of FIG. 1. Also, the plane surface of the 0.12 $\mu$m-thick boron foil was examined by transmission electron microscopy in plane view in both bright-field (BF) and dark-field (DF) images, see FIGS. 2a and 2b. There was no evidence of growth morphology such as columnar grains or crystallinity.

It has thus been shown that this invention involves the fabrication of thin films or coatings of boron nitride, cubic boron nitride, and multilayer films or coatings of boron/cubic boron nitride, and involves a process which utilizes rf magnetron sputtering, and simply changing the composition of the sputtering gas. The boron films, as well as the boron/boron carbide multilayers, are produced in an inert atmosphere, such as argon, helium, neon, krypton, and xenon, with argon being preferred; and the cubic boron nitride films are produced in a reactive atmosphere such as nitrogen, ammonia, ammonia-nitrogen-argon, and mixtures of nitrogen and argon, with nitrogen preferred. The boron/cubic boron nitride multilayers are formed by alternating an inert gas and then a reactive gas with a single pure boron target. The atmosphere for the multilayer B/c-BN films, for example, may also contain, for example, a mixed gas of argon (Ar) and nitrogen ($N_2$) containing 5 to 100% nitrogen to produce diffused (blended or graded) layers. Also, a reactive sputter gas (A-$N_2$ mixture) may be used with hexagonal boron nitride targets, but this results in hexagonal boron nitride (h-BN) in the films, and such are not as hard as c-BN.

The thus produced boron nitride and cubic boron nitride films or coatings, and the multilayer boron/cubic boron nitride multilayer films or coatings, may be deposited on substrates, etc. for use in electronic components, or on tool surfaces for machining hard metals, as well as on engine parts to reduce friction and wear. The uniqueness of the invention is the ability to deposit boron containing films, by rf magnetron sputtering a boron target using an inert sputter gas (e.g. argon), the measure of hardness of these films (4300 Vickers), the ability to reactively sputter cubic boron nitride by rf magnetron sputtering a boron target in reactive sputter gas (e.g. nitrogen), or in a mixed inert/reactive sputter gas (e.g. Ar and $N_2$ containing 5–100% $N_2$.) Multilayer coatings of B and c-BN by this process produces a hard coating and provides a unique way of controlling stress in the coatings.

While particular embodiments, process parameters, materials, gases, etc. have been set forth to describe the invention and the process involved, such are not intended to limit the invention. Modifications and changes will become apparent to those skilled in the art, and it is intended that the invention be limited only by the scope of the appended claims.

We claim:

1. A process for producing a thin film containing boron, comprising:

subjecting a substantially pure boron target having a density of about theoretical density to an rf magnetron sputtering process in an atmosphere selected from the group of inert and reactive gases; and depositing a thin film containing boron on a surface.

2. The process of claim 1, wherein the atmosphere is composed of an inert gas selected from the group of argon, helium, neon, krypton, and xenon, and wherein the deposited thin film is composed of boron.

3. The process of claim 1, wherein the atmosphere is composed of a reactive gas selected from the group of nitrogen, ammonia, ammonia-nitrogen-argon, and mixtures of nitrogen and argon; and wherein the deposited thin film is composed of predominantly cubic boron nitride.

4. The process of claim 1, wherein the atmosphere is alternated between an inert gas and a reactive gas, and wherein the deposited thin film is composed of alternating layers of boron and boron nitride.

5. The process of claim 1, wherein the atmosphere is alternated between an inert gas and a reactive gas, and wherein the deposited thin film is composed of alternating layers of boron and predominantly cubic boron nitride.

6. The process of claim 5, wherein the alternating layers have a thickness in the range of 1 nanometer to 1 micrometer.

7. The process of claim 5, wherein the atmosphere is composed of about 5–100% of a reactive gas and about 95–0% of an inert gas, and wherein the deposited thin film is composed of alternating layers of a blended composition of boron and cubic boron nitride.

8. A method for forming a thin film of cubic boron nitride on a surface, comprising:

exposing a substantially pure boron target having a density of about theoretical density to an rf magnetron sputtering process in an atmosphere containing a reactive gas; and depositing a thin film of cubic boron nitride on a surface.

9. The method of claim 8, wherein the reactive gas atmosphere is selected from the group consisting of nitrogen, ammonia, ammonianitrogen-argon, and nitrogen/argon mixtures.

10. The method of claim 9, wherein the reactive gas atmosphere is nitrogen.

11. The method of claim 8, wherein the atmosphere containing a reactive gas contains from 5–100% nitrogen gas.

12. A method for fabricating a thin film consisting of alternating layers of boron and boron nitride or boron and predominantly cubic boron nitride, comprising:

subjecting a substantially pure boron target having a density of about theoretical density to an rf magnetron sputtering process in an atmosphere selected from the group of inert and reactive gases, and alternated between an inert gas and a reactive gas, and depositing a thin film of alternating layers of boron and either boron nitride or predominantly cubic boron nitride.

13. the method of claim 12, wherein the depositing is carried out so as to produce a thin film of alternating layers consisting of layers of boron and boron nitride.

14. The method of claim 12, wherein the depositing is carried out so as to produce a thin film of alternating layers of boron and predominantly cubic boron nitride.

15. The method of claim 12, additionally including utilizing an atmosphere of an inert gas selected from the group consisting of argon, helium, neon, kypton, and xenon, and wherein the thus deposited thin film consists of alternating layers of boron and boron nitride.

16. The method of claim 12, additionally including utilizing an atmosphere of a reactive gas selected from the group consisting of nitrogen, ammonia, ammonia-nitrogen-argon, and mixtures of nitrogen and argon; and wherein the thus deposited thin film consists of alternating layers of boron and predominantly cubic boron nitride.

17. The method of claim 16, wherein the reactive gas atmosphere is composed of nitrogen.

18. The method of claim 16, wherein the reactive gas atmosphere contains from 5–100% nitrogen gas.

19. The method of claim 12, additionally including providing the atmosphere so as to be composed of about 5–100% of a reactive gas and about 95–0% of an inert gas, and wherein the depositing is carried out using alternating layers of a blended composition of boron and cubic boron nitride.

20. The method of claim 12, wherein the alternating layers consist of boron and predominantly cubic boron nitride, wherein the thin film of alternating layers is deposited to a thickness of about 1–10 μm, and wherein the alternating layers are produced by alternately rf magnetron sputtering of a single substantially pure boron target in an inert gas atmosphere composed of argon and then in a reactive gas atmosphere composed of nitrogen.

\* \* \* \* \*